United States Patent
Sakai et al.

(10) Patent No.: US 11,777,545 B2
(45) Date of Patent: Oct. 3, 2023

(54) INTERFERENCE CANCELLATION DEVICE, CONTROL CIRCUIT, STORAGE MEDIUM, AND INTERFERENCE CENTER FREQUENCY ESTIMATION METHOD

(71) Applicant: Mitsubishi Electric Corporation, Tokyo (JP)

(72) Inventors: Manabu Sakai, Tokyo (JP); Koji Tomitsuka, Tokyo (JP); Hiroki Iura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/847,930

(22) Filed: Jun. 23, 2022

(65) Prior Publication Data

US 2022/0329274 A1    Oct. 13, 2022

Related U.S. Application Data

(63) Continuation of application No. PCT/JP2020/007484, filed on Feb. 25, 2020.

(51) Int. Cl.
  *H04B 1/10* (2006.01)
(52) U.S. Cl.
  CPC ...................... *H04B 1/10* (2013.01)
(58) Field of Classification Search
  CPC . H04J 11/0023; H04B 1/0475; H04B 1/1027; H04B 1/7107; H04B 17/345; H04B 1/109; H04B 1/10; G01R 23/14
  See application file for complete search history.

(56) References Cited

U.S. PATENT DOCUMENTS

| | | | |
|---|---|---|---|
| 8,060,047 B2 | 11/2011 | Maeda et al. | |
| 11,336,317 B2 | 5/2022 | Tomitsuka et al. | |
| 2010/0048151 A1* | 2/2010 | Hara | H04L 5/0048 455/115.1 |
| 2012/0314824 A1* | 12/2012 | Fujimura | H04B 1/1036 375/350 |
| 2015/0289154 A1 | 10/2015 | Pratt | |

(Continued)

FOREIGN PATENT DOCUMENTS

| | | |
|---|---|---|
| JP | 2007-324753 A | 12/2007 |
| JP | 2017-227655 A | 12/2017 |

(Continued)

*Primary Examiner* — Aristocratis Fotakis
(74) *Attorney, Agent, or Firm* — Birch, Stewart, Kolasch & Birch, LLP

(57) ABSTRACT

An interference cancellation device includes a data symbol extraction unit that extracts a data symbol portion from a received signal, a null symbol extraction unit that extracts a null symbol portion from the received signal, a data symbol power calculation unit that calculates a data symbol power estimated value, a null symbol power calculation unit that calculates a null symbol power estimated value, a null symbol spectrum calculation unit that calculates a null symbol spectrum from a null symbol signal, and an interference center frequency estimation unit that eliminates the effect of an image for an interference in calculation of an interference bandwidth when is calculating an interference center frequency estimated value, using a data symbol signal, the data symbol power estimated value, the null symbol power estimated value, and the null symbol spectrum.

19 Claims, 11 Drawing Sheets

(56) References Cited

U.S. PATENT DOCUMENTS

| | | | | |
|---|---|---|---|---|
| 2017/0085334 A1* | 3/2017 | Ishioka | ............... | H04L 27/2605 |
| 2018/0054343 A1* | 2/2018 | Suzuki | .................... | H04L 5/008 |
| 2021/0135698 A1* | 5/2021 | Tomitsuka | ............. | H04B 1/109 |
| 2021/0367639 A1* | 11/2021 | Tomitsuka | ........... | H04B 1/7107 |

FOREIGN PATENT DOCUMENTS

| JP | 2019-54318 A | 4/2019 |
|---|---|---|
| WO | WO 2019/167140 A1 | 9/2019 |
| WO | WO 2020/183544 A1 | 9/2020 |

\* cited by examiner

INTERFERENCE CANCELLATION DEVICE, CONTROL CIRCUIT, STORAGE MEDIUM, AND INTERFERENCE CENTER FREQUENCY ESTIMATION METHOD

CROSS-REFERENCE TO RELATED APPLICATION

This application is a continuation application of International Application PCT/JP2020/007484, filed on Feb. 25, 2020, and designating the U.S., the entire contents of which are incorporated herein by reference.

BACKGROUND OF THE INVENTION

1. Field of the Invention

The present disclosure relates to an interference cancellation device, a control circuit, a storage medium, and an interference center frequency estimation method, each for eliminating interference from a received signal.

2. Description of the Related Art

One conventional method for eliminating interference from a received signal in a reception device includes interference cancellation utilizing intermittent symbol transmission. For the interference cancellation utilizing the intermittent symbol transmission, a transmission device inserts a non-transmission interval, i.e., a null symbol, between transmitted symbols, and then transmits a signal. The reception device replicates an interference component superimposed on a data portion, from the interference component superimposed on a null symbol portion of the received signal, and cancels the interference. In this operation, correctly estimating where the interference signal is in the system bandwidth improves interference cancellation performance. A method for estimating the interference frequency band, disclosed in Japanese Patent Application Laid-open No. 2017-227655, involves estimating the frequency center of the interference signal band by gradually increasing the resolution of spectrum reproduction.

When the technique described in Japanese Patent Application Laid-open No. 2017-227655 is applied to the interference cancellation utilizing the intermittent symbol transmission, that technique generates an "image" for the actual interference under the influence of down-sampling in estimating the interference frequency band from the spectrum of the interference component superimposed on a null symbol portion. Unfortunately, the technique described in Japanese Patent Application Laid-open No. 2017-227655 suffers from the problem of failure to distinguish between the actual interference and that image.

SUMMARY OF THE INVENTION

To solve the problem, an interference cancellation device of the present disclosure comprises: a data symbol extraction unit to extract a data symbol portion from a received signal having null symbols inserted into data symbols, and output a data symbol signal; a null symbol extraction unit to extract a null symbol portion from the received signal, and output a null symbol signal; a data symbol power calculation unit to calculate a data symbol power estimated value representing electric power of the data symbol signal; a null symbol power calculation unit to calculate a null symbol power estimated value representing electric power of the null symbol signal; a null symbol spectrum calculation unit to calculate a null symbol spectrum from the null symbol signal; and an interference center frequency estimation unit to calculate an interference center frequency estimated value of an interference included in the received signal, using the data symbol signal, the data symbol power estimated value, the null symbol power estimated value, and the null symbol spectrum, wherein, in calculating the interference center frequency estimated value, the interference center frequency estimation unit compares the null symbol spectrum with a predefined threshold, and determines that a half of total bandwidth of frequency bands each having electric power in excess of the threshold is an interference bandwidth of the interference, and, in calculation of the interference bandwidth, the interference center frequency estimation unit eliminates an effect of an image for the interference.

DETAILED DESCRIPTION OF THE PREFERRED EMBODIMENTS

An interference cancellation device, a control circuit, a storage medium, and an interference center frequency estimation method according to embodiments of the present disclosure will be described in detail below with reference to the drawings. Note that these embodiments are not intended to limit the scope of this disclosure.

First Embodiment

Figure 1:
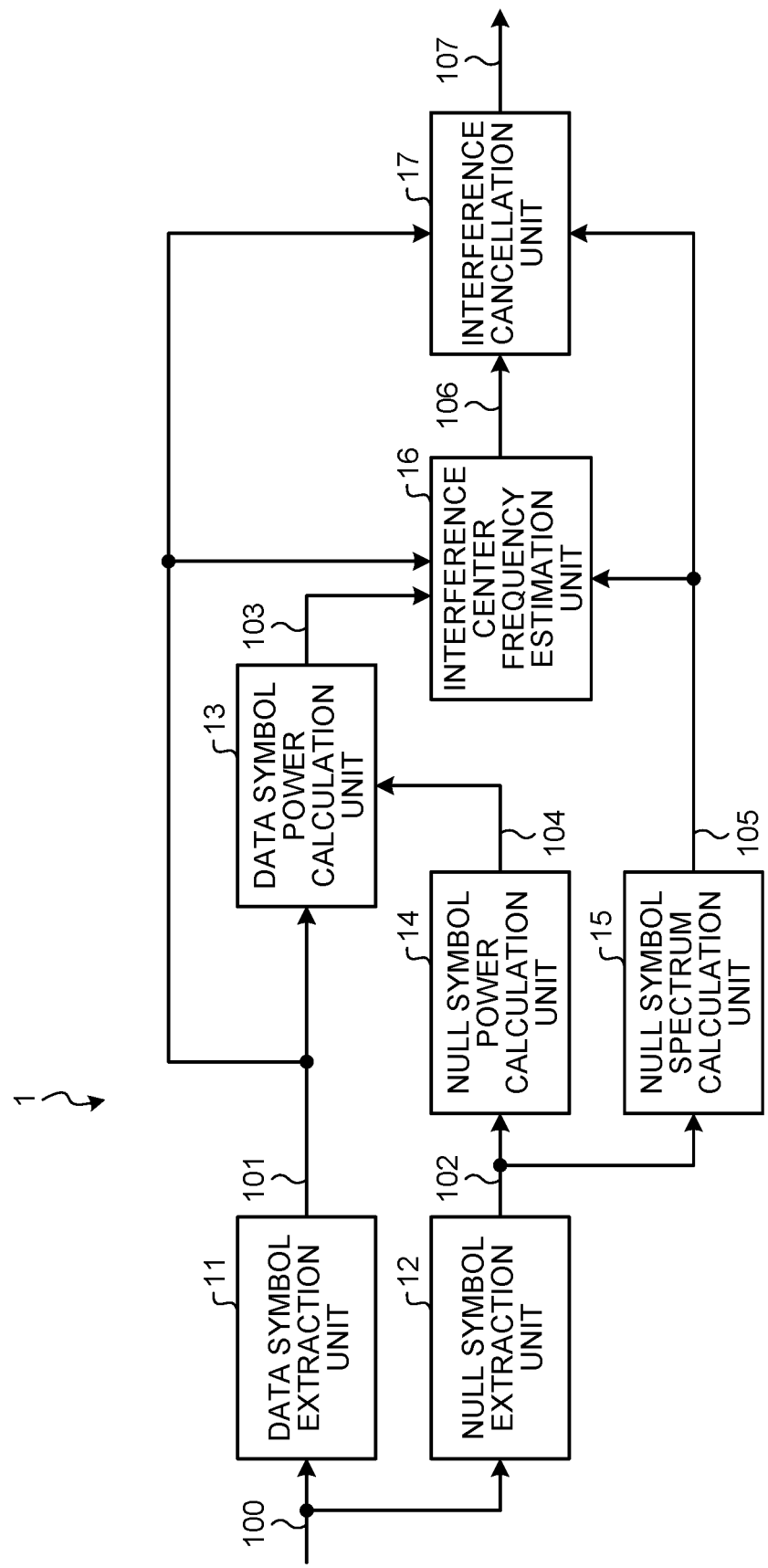
FIG. 1 is a block diagram illustrating an example configuration of an interference cancellation device according to a first embodiment.

FIG. 1 is a block diagram illustrating an example configuration of an interference cancellation device 1 according to a first embodiment. The interference cancellation device 1 is a device to be installed in a reception device etc. not illustrated. The interference cancellation device 1 eliminates, from a received signal 100, interference that has occurred in a propagation channel between a transmission device, which is a source of the signal (not illustrated), and the reception device. The received signal 100 is a signal received by the reception device. The present embodiment is based on the assumption that the transmission device inserts null symbols into data symbols at a ratio of 1:1 in the transmission signal, that is, inserts null symbols such that a data symbol and a null symbol occur alternately. The received signal 100 received by the reception device have null symbols inserted into data symbols.

Figure 2:
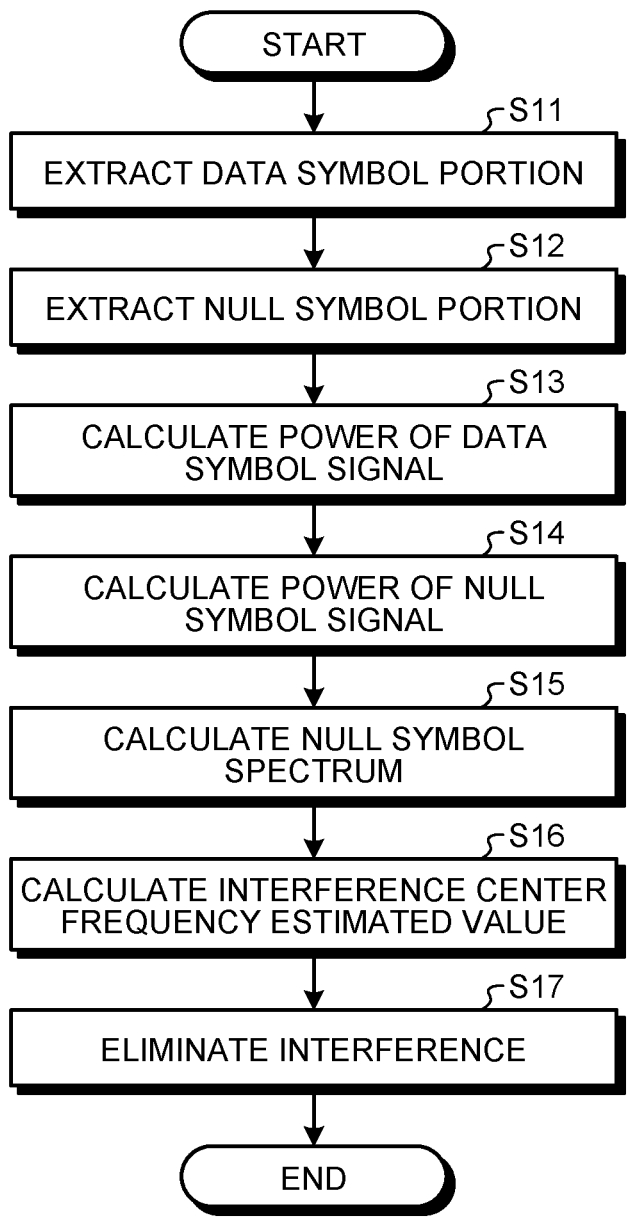
FIG. 2 is a flowchart illustrating an operation of the interference cancellation device according to the first embodiment.

A configuration and an operation of the interference cancellation device 1 will now be described. As illustrated in FIG. 1, the interference cancellation device 1 includes a data symbol extraction unit 11, a null symbol extraction unit 12, a data symbol power calculation unit 13, a null symbol power calculation unit 14, a null symbol spectrum calculation unit 15, an interference center frequency estimation unit 16, and an interference cancellation unit 17. FIG. 2 is a flowchart illustrating an operation of the interference cancellation device 1 according to the first embodiment.

The data symbol extraction unit 11 extracts only a data symbol portion from the received signal 100 in synchronization with a data symbol (step S11). The data symbol extraction unit 11 outputs a data symbol signal 101.

The null symbol extraction unit 12 extracts only a null symbol portion from the received signal 100 in synchronization with a null symbol (step S12). The null symbol extraction unit 12 outputs a null symbol signal 102.

The data symbol power calculation unit 13 calculates electric power (hereinafter sometimes referred to simply as power) $P_0$ of the data symbol signal 101 (step S13). The electric power $P_0$ is expressed as Equation (1), where $r_D(k)$ represents a k-th symbol of the data symbol signal 101. Note that K in Equation (1) represents the number of symbols used in the electric power calculation.

[Formula 1]

$$P_0 = \frac{1}{K}\sum_{k=0}^{K}|r_D(k)|^2 \qquad (1)$$

The null symbol power calculation unit 14 calculates electric power $P_1$ of the null symbol signal 102 (step S14). The electric power $P_1$ is expressed as Equation (2), where $r_N(l)$ represents an l-th signal of the null symbol signal 102. Note that L in Equation (2) represents the number of symbols used in the electric power calculation.

[Formula 2]

$$P_1 = \frac{1}{L}\sum_{l=0}^{L}|r_N(l)|^2 \qquad (2)$$

The data symbol signal 101 includes the data symbols, an interference, and a noise. In addition, the null symbol signal 102 includes an interference and a noise. That is, $P_0$=D+I+N and $P_1$=I+N, where D represents transmission data symbol power, I represents interference power, and N represents noise power. Accordingly, the data symbol power calculation unit 13 calculates $P_0$–$P_1$, i.e., a data symbol power estimated value 103 that represents the electric power of the data symbol signal 101. In addition, the null symbol power calculation unit 14 calculates a null symbol power estimated value 104 as $P_1$=null symbol power estimated value 104.

The null symbol spectrum calculation unit 15 calculates a null symbol spectrum 105 from the null symbol signal 102 (step S15). The null symbol spectrum calculation unit 15 calculates the null symbol spectrum 105 using, for example, fast Fourier transform (FFT).

The interference center frequency estimation unit 16 calculates an interference center frequency estimated value 106, using the data symbol signal 101, the data symbol power estimated value 103, and the null symbol spectrum 105 (step S16).

The interference cancellation unit 17 performs interference cancellation on the data symbol signal 101, using an interference replica signal generated on the basis of information on the interference center frequency estimated value 106 and on the null symbol spectrum 105 (step S17). The interference cancellation unit 17 outputs an interference-canceled received signal 107 that is a signal resulting from elimination of interference from the data symbol signal 101.

Figure 3:
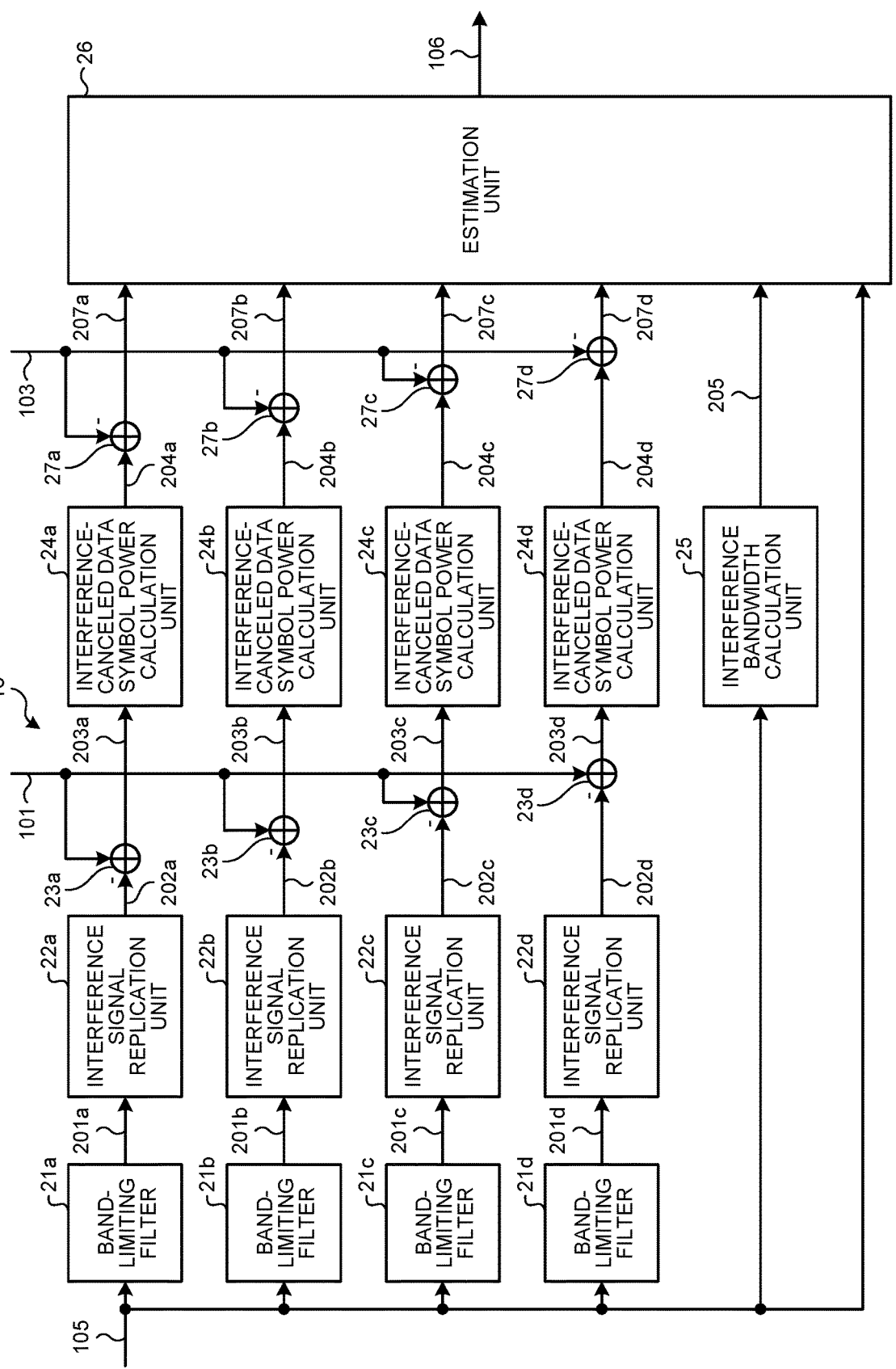
FIG. 3 is a block diagram illustrating an example configuration of the interference center frequency estimation unit according to the first embodiment.
Figure 4:
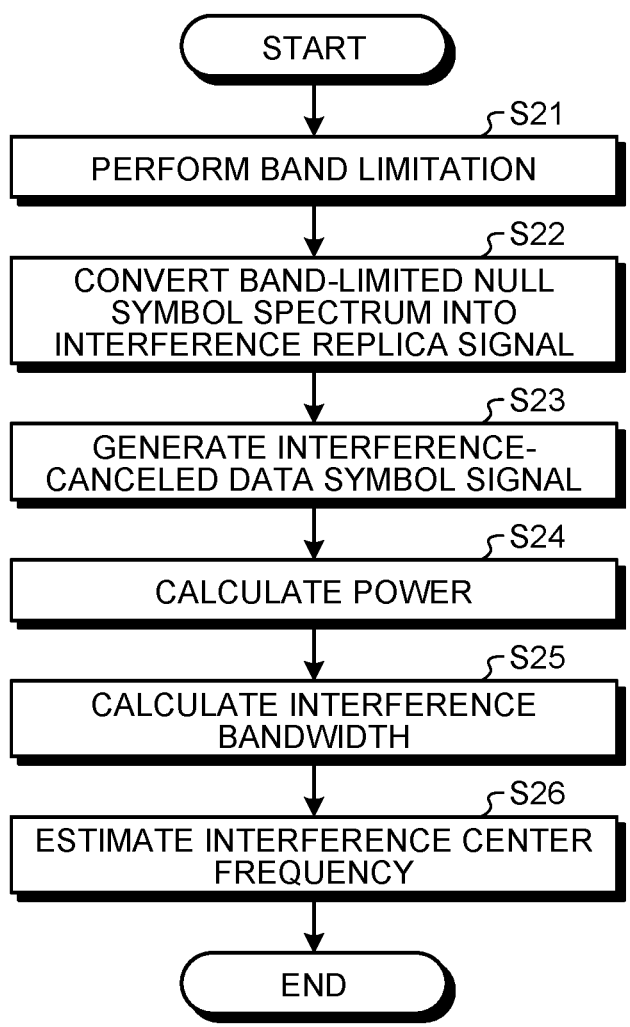
FIG. 4 is a flowchart illustrating an operation of the interference center frequency estimation unit according to the first embodiment.

A configuration and an operation of the interference center frequency estimation unit 16 included in the interference cancellation device 1 will next be described in detail. FIG. 3 is a block diagram illustrating an example configuration of the interference center frequency estimation unit 16 according to the first embodiment. As illustrated in FIG. 3, the interference center frequency estimation unit 16 includes band-limiting filters 21a, 21b, 21c, and 21d, interference signal replication units 22a, 22b, 22c, and 22d, subtraction units 23a, 23b, 23c, and 23d, interference-canceled data symbol power calculation units 24a, 24b, 24c, and 24d, an interference bandwidth calculation unit 25, an estimation unit 26, and subtraction units 27a, 27b, 27c, and 27d. FIG. 4 is a flowchart illustrating an operation of the interference center frequency estimation unit 16 according to the first embodiment.

Figure 5:
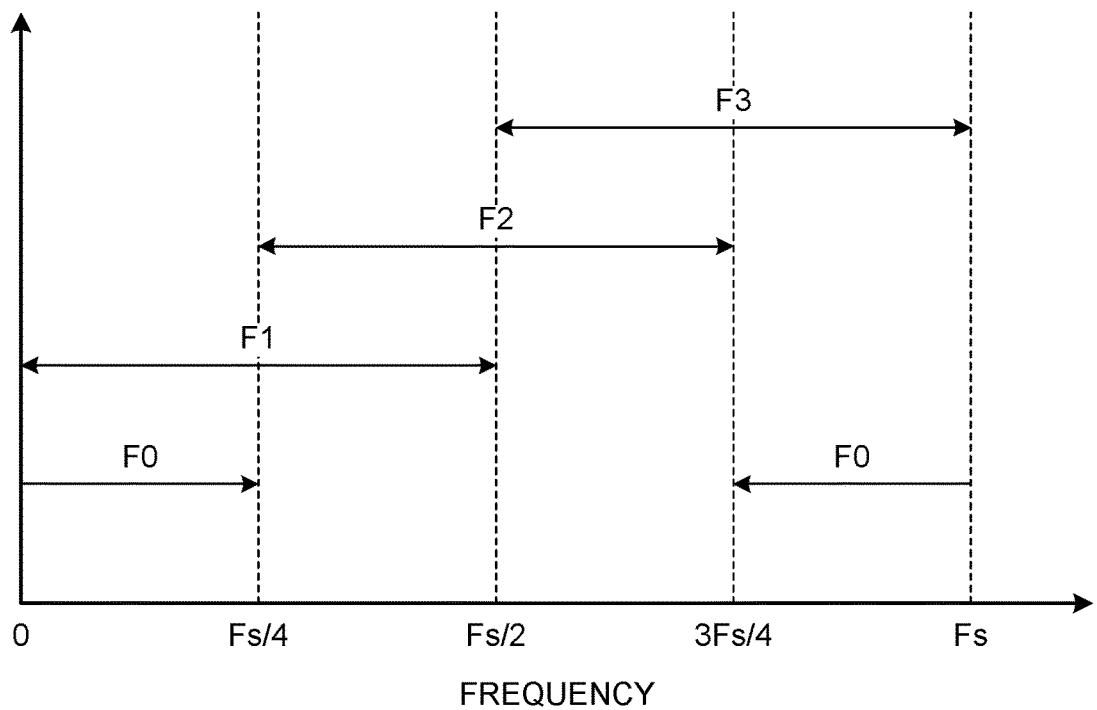
FIG. 5 is a diagram illustrating relationships among the passbands of individual band-limiting filters and the system bandwidth according to the first embodiment.

The band-limiting filters 21a to 21d limit the band of the null symbol spectrum 105 to four different passbands (step S21). The passband bandwidths of the individual band-limiting filters 21a to 21d are all 50% of the system bandwidth, but the passbands are different from one another. The passbands of the individual band-limiting filters 21a to 21d each overlap the adjacent passband by 25% of the system bandwidth. FIG. 5 is a diagram illustrating relationships among passbands F0 to F3 of the individual band-limiting filters 21a to 21d and a system bandwidth Fs according to the first embodiment. In FIG. 5, Fs is the system bandwidth, F0 is the passband of the band-limiting filter 21a, F1 is the passband of the band-limiting filter 21b, F2 is the passband of the band-limiting filter 21c, and F3 is the passband of the band-limiting filter 21d.

Specifically, the band-limiting filter 21a limits the band of the null symbol spectrum 105 to passband F0, and generates and outputs a band-limited null symbol spectrum 201a. Similarly, the band-limiting filter 21b limits the band of the null symbol spectrum 105 to passband F1, and generates and outputs a band-limited null symbol spectrum 201b. The band-limiting filter 21c limits the band of the null symbol spectrum 105 to passband F2, and generates and outputs a band-limited null symbol spectrum 201c. The band-limiting filter 21d limits the band of the null symbol spectrum 105 to passband F3, and generates and outputs a band-limited null symbol spectrum 201d.

The interference signal replication unit 22a converts the band-limited null symbol spectrum 201a resulting from band limitation, into an interference replica signal 202a in time domain (step S22). Similarly, the interference signal replication unit 22b converts the band-limited null symbol spectrum 201b resulting from band limitation, into an interference replica signal 202b in time domain. The interference signal replication unit 22c converts the band-limited null symbol spectrum 201c resulting from band limitation, into an interference replica signal 202c in time domain. The interference signal replication unit 22d converts the band-limited null symbol spectrum 201d resulting from band limitation, into an interference replica signal 202d in time domain. The interference signal replication units 22a to 22d use, for example, inverse fast Fourier transform (IFFT).

The subtraction unit 23a performs interference cancellation on the data symbol signal 101, using the interference replica signal 202a and generates an interference-canceled data symbol signal 203a (step S23). Similarly, the subtraction unit 23b performs interference cancellation on the data symbol signal 101, using the interference replica signal 202b and generates an interference-canceled data symbol signal 203b. The subtraction unit 23c performs interference cancellation on the data symbol signal 101, using the interference replica signal 202c and generates an interference-canceled data symbol signal 203c. The subtraction unit 23d performs interference cancellation on the data symbol signal 101, using the interference replica signal 202d and generates an interference-canceled data symbol signal 203d.

The interference-canceled data symbol power calculation unit 24a calculates the electric power of the interference-canceled data symbol signal 203a (step S24), and outputs an interference-canceled data symbol power value 204a. Similarly, the interference-canceled data symbol power calculation unit 24b calculates the electric power of the interference-canceled data symbol signal 203b, and outputs an interference-canceled data symbol power value 204b. The interference-canceled data symbol power calculation unit 24c calculates the electric power of the interference-canceled data symbol signal 203c, and outputs an interference-canceled data symbol power value 204c. The interference-canceled data symbol power calculation unit 24d calculates the electric power of the interference-canceled data symbol signal 203d, and outputs an interference-canceled data symbol power value 204d. The subtraction unit 27a subtracts the data symbol power estimated value 103 from the interference-canceled data symbol power value 204a to thereby output a residual interference-noise power value 207a. The subtraction unit 27b subtracts the data symbol power estimated value 103 from the interference-canceled data symbol power value 204b to thereby output a residual interference-noise power value 207b. The subtraction unit 27c subtracts the data symbol power estimated value 103 from the interference-canceled data symbol power value 204c to thereby output a residual interference-noise power value 207c. The subtraction unit 27d subtracts the data symbol power estimated value 103 from the interference-canceled data symbol power value 204d to thereby output a residual interference-noise power value 207d.

Figure 6:
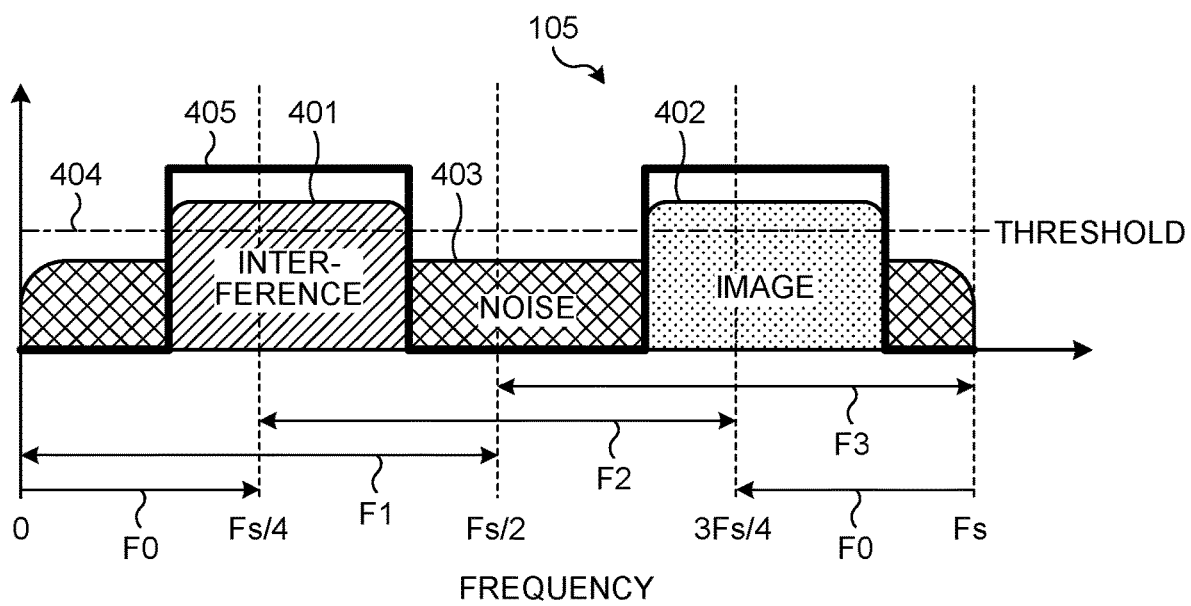
FIG. 6 is a diagram illustrating an example of null symbol spectrum calculated by the null symbol spectrum calculation unit of the interference cancellation device according to the first embodiment.

The interference bandwidth calculation unit 25 determines that a frequency band in the null symbol spectrum 105 is an interference band as this frequency band has electric power in excess of a predetermined threshold. The interference bandwidth calculation unit 25 marks such an interference band. For example, assume that the null symbol spectrum 105 is shaped as illustrated in FIG. 6. FIG. 6 is a diagram illustrating an example of the null symbol spectrum 105 calculated by the null symbol spectrum calculation unit 15 of the interference cancellation device 1 according to the first embodiment. The null symbol spectrum 105 includes an interference 401, an image 402 for the interference 401, and a noise 403. The interference bandwidth calculation unit 25 determines that frequency bands each having electric power in excess of a predetermined threshold 404 are interference bands 405, and marks these interference bands 405. The interference bands 405 marked by the interference bandwidth calculation unit 25 are the interference 401 and the image 402, and the bandwidth thereof is therefore twice the interference bandwidth of the actual interference 401. Accordingly, the interference bandwidth calculation unit 25 divides the interference bandwidth of the interference bands 405 by 2 to thereby calculate an interference bandwidth 205 of the actual interference 401 (step S25). In calculating the interference center frequency estimated value 106, as discussed above, the interference bandwidth calculation unit 25 of the interference center frequency estimation unit 16 compares the null symbol spectrum 105 with the predefined threshold 404, and determines that a half of the total bandwidth of the frequency bands each having electric power in excess of the threshold 404 is the interference bandwidth 205 of the interference 401. In the calculation of the interference bandwidth 205, the interference bandwidth calculation unit 25 eliminates the effect of the image 402 for the interference 401.

The estimation unit 26 estimates the interference center frequency, using the residual interference-noise power values 207a to 207d, the interference bandwidth 205, and the null symbol spectrum 105 (step S26). The estimation unit 26 outputs the interference center frequency estimated value 106.

Figure 7:
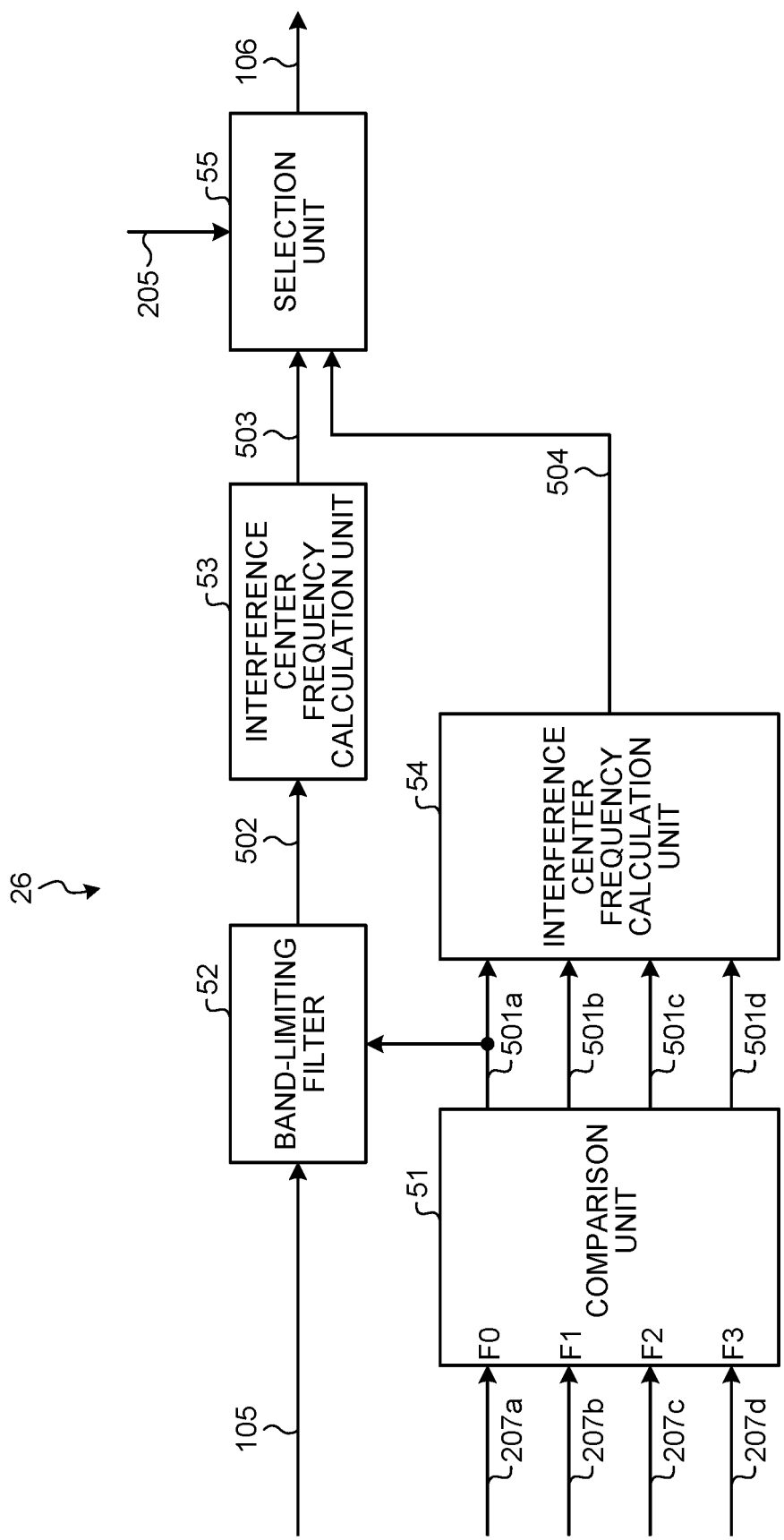
FIG. 7 is a block diagram illustrating an example configuration of the estimation unit according to the first embodiment.
Figure 8:
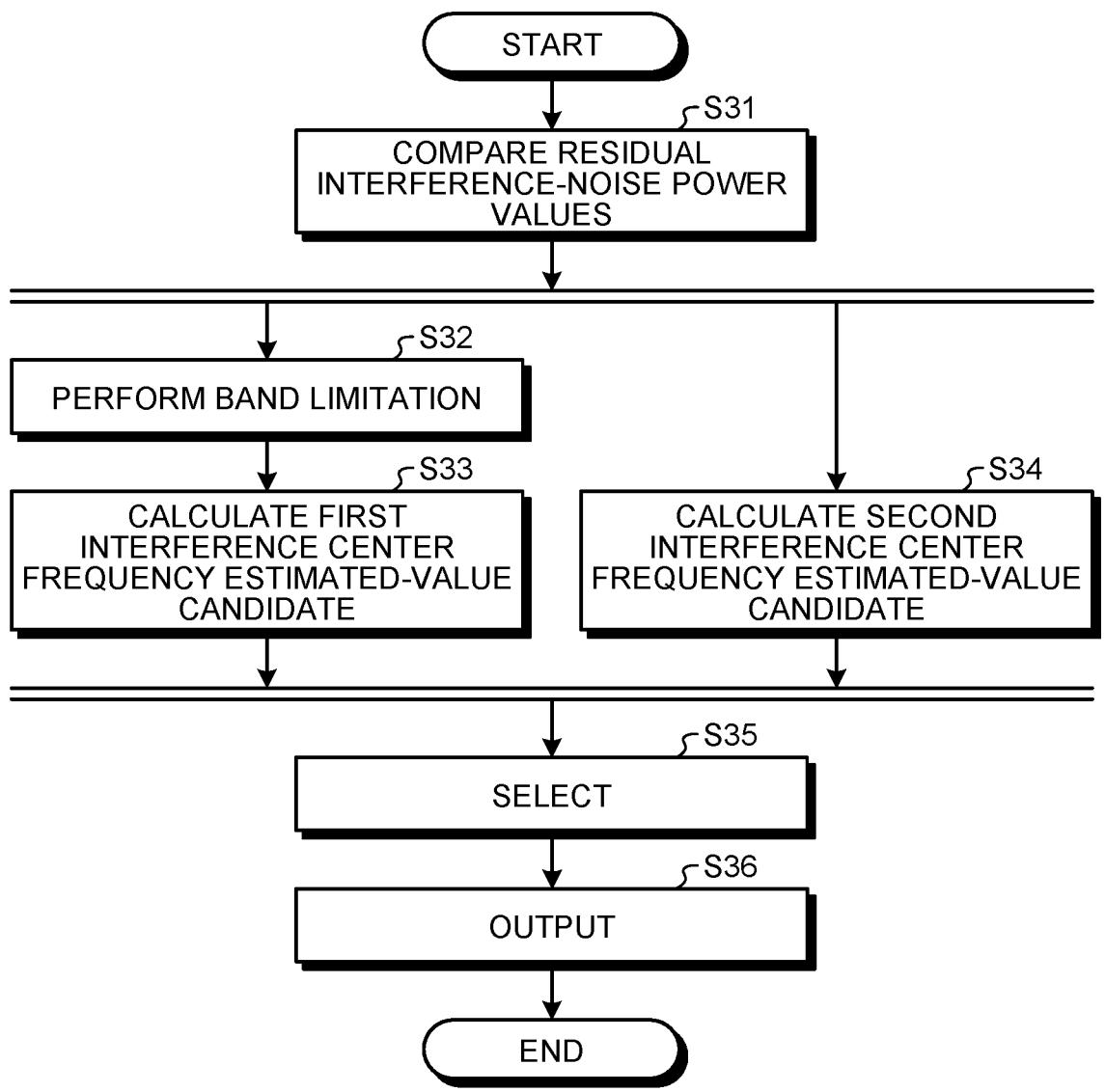
FIG. 8 is a flowchart illustrating an operation of the estimation unit according to the first embodiment.

A configuration and an operation of the estimation unit 26 included in the interference center frequency estimation unit 16 will next be described in detail. FIG. 7 is a block diagram illustrating an example configuration of the estimation unit 26 according to the first embodiment. As illustrated in FIG. 7, the estimation unit 26 includes a comparison unit 51, a band-limiting filter 52, an interference center frequency calculation unit 53, an interference center frequency calculation unit 54, and a selection unit 55. FIG. 8 is a flowchart illustrating an operation of the estimation unit 26 according to the first embodiment.

The comparison unit 51 compares the residual interference-noise power values 207a to 207d (step S31), and provides outputs corresponding to the magnitudes of the residual interference-noise power values 207a to 207d. Specifically, the comparison unit 51 calculates the lowest one of the residual interference-noise power values, and outputs an interference main band 501a among passbands F0 to F3. For example, when the residual interference-noise power value 207c associated with passband F2 among passbands F0 to F3 is the lowest, passband F2 is the interference main band 501a. In this case, the comparison unit 51 outputs the lowest residual interference-noise power value as an interference main band residual interference-noise power 501b. The comparison unit 51 also outputs an interference sub-band lower-portion residual interference-noise power 501c that is the residual interference-noise power value in an adjacent lower band to the interference main band 501a. The comparison unit 51 further outputs an interference sub-band upper-portion residual interference-noise power 501d that is the residual interference-noise power value of an adjacent upper band to the interference main band 501a. For example, when the residual interference-noise power value 207c associated with passband F2 is the lowest, the interference main band residual interference-noise power 501b is the residual interference-noise power value 207c associated with passband F2. In this case, the interference sub-band lower-portion residual interference-noise power 501c is the residual interference-noise power value 207b associated with passband F1, and the interference sub-band upper-portion residual interference-noise power 501d is the residual interference-noise power value 207d associated with passband F3.

The estimation unit 26 estimates the interference center frequency through the following two methods. Method 1 will be described first. On the basis of the interference main band 501a, the band-limiting filter 52 limits the band of the null symbol spectrum 105 to only the interference main band serving as the passband (step S32). The band-limiting filter 52 outputs an interference main band spectrum 502.

The interference center frequency calculation unit 53 calculates a first candidate for the interference center frequency estimated value (hereinafter, first interference center frequency estimated-value candidate) 503 from the interference main band spectrum 502 (step S33). The interference center frequency calculation unit 53 outputs the first interference center frequency estimated-value candidate 503. The first interference center frequency estimated-value candidate 503 is expressed as Equation (3), where p(k) represents the electric power of each frequency bin $f_k$ in the interference main band spectrum 502.

[Formula 3]

$$f_c = \frac{\sum_{k=0}^{K-1} f_k p(k)}{\sum_{k=0}^{K-1} p(k)} \quad (3)$$

The first interference center frequency estimated-value candidate 503 expressed by Equation (3) is the weighted average for the individual frequency bins $f_k$ using the spectral power as the weight. That is, the interference center frequency calculation unit 53 calculates the first interference center frequency estimated-value candidate 503 based on the weighted average of the interference spectrum, using the null symbol spectrum 105.

Figure 9:
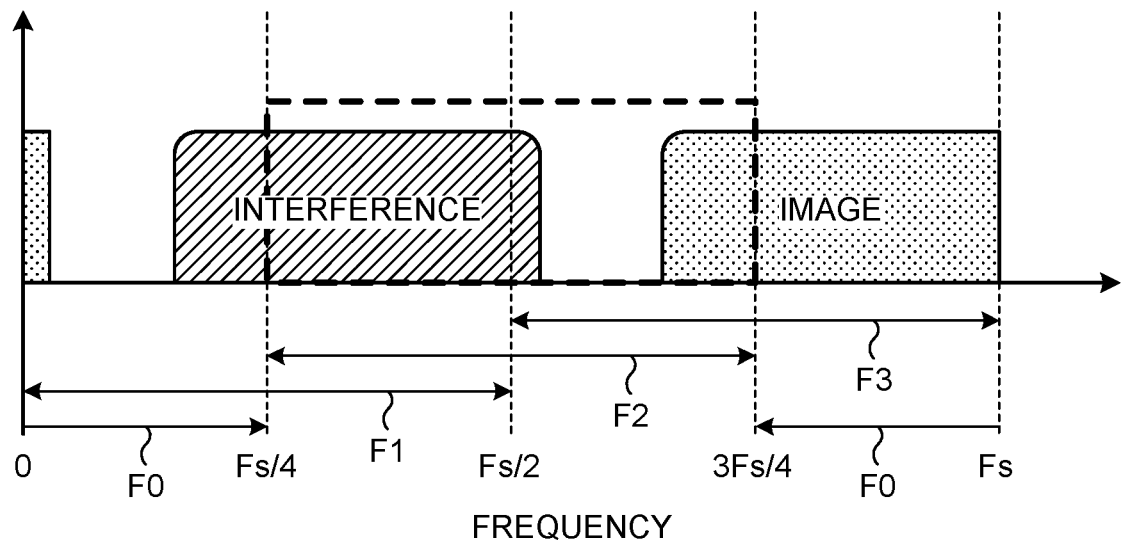
FIG. 9 is a diagram illustrating an example of interference to be eliminated by the interference cancellation device according to the first embodiment.

Method 2 will next be described. The interference center frequency calculation unit 54 calculates a second candidate for the interference center frequency estimated value (hereinafter, second interference center frequency estimated-value candidate) 504, using the interference main band residual interference-noise power 501b, the interference sub-band lower-portion residual interference-noise power 501c, and the interference sub-band upper-portion residual interference-noise power 501d (step S34). For a broad interference bandwidth, for example, an interference is present over multiple passbands, as illustrated in FIG. 9. FIG. 9 is a diagram illustrating an example of interference to be eliminated by the interference cancellation device 1 according to the first embodiment.

Figure 10:
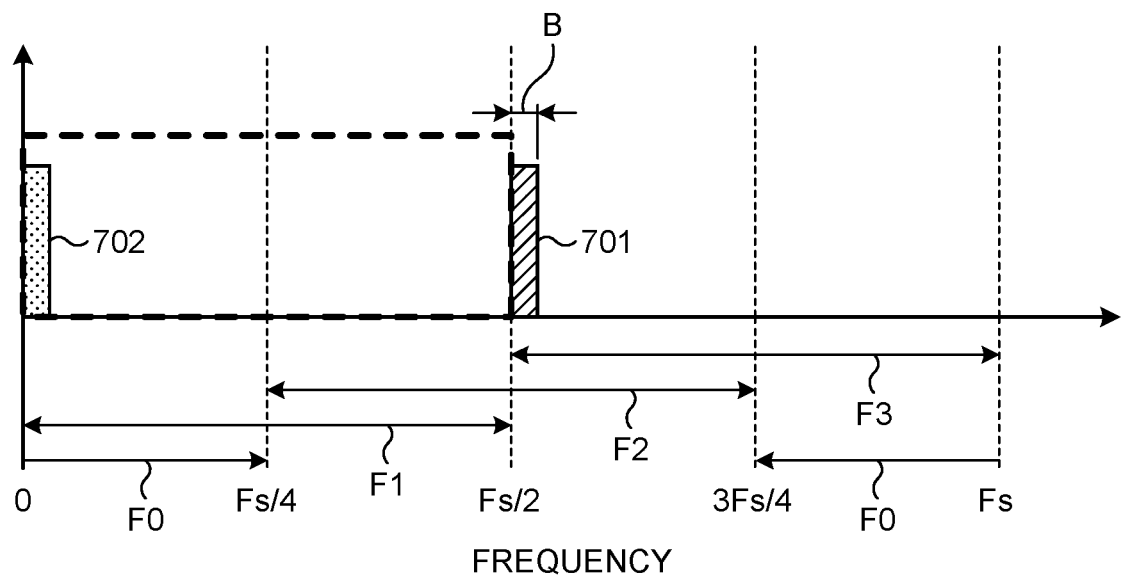
FIG. 10 is a diagram illustrating an example of spectrum resulting from interference cancellation performed on the interference illustrated in FIG. 9 by band limitation to passband F1, in the interference cancellation device according to the first embodiment.

In the case of performing interference cancellation on the interference illustrated in FIG. 9, using the interference replica generated as a result of the limitation of the band to passband F1 that is the main band, the spectrum resulting from the interference cancellation appears as illustrated in FIG. 10. FIG. 10 is a diagram illustrating an example of spectrum resulting from interference cancellation performed on the interference illustrated in FIG. 9 by band limitation to passband F1, in the interference cancellation device 1 according to the first embodiment. As illustrated in FIG. 10, two elements, i.e., a residual interference 701 and a residual interference 702 remain as residual interference. The residual interference 701 is a portion protruding out from passband F1. The residual interference 702 is a falsely replicated image. In this case, the residual interference-noise power value is proportional to the frequency width of the portion protruding out from passband F1. When interference cancellation is performed using passband F1 illustrated in FIG. 10, residual interference-noise power $P_M$ is expressed by Equation (4). Note that, in Equation (4), B represents the bandwidth of the residual interference, W represents the interference bandwidth, I represents the interference power, and N represents the noise power.

[Formula 4]

$$P_M = \frac{2B}{W} I + 2N \quad (4)$$

Figure 11:
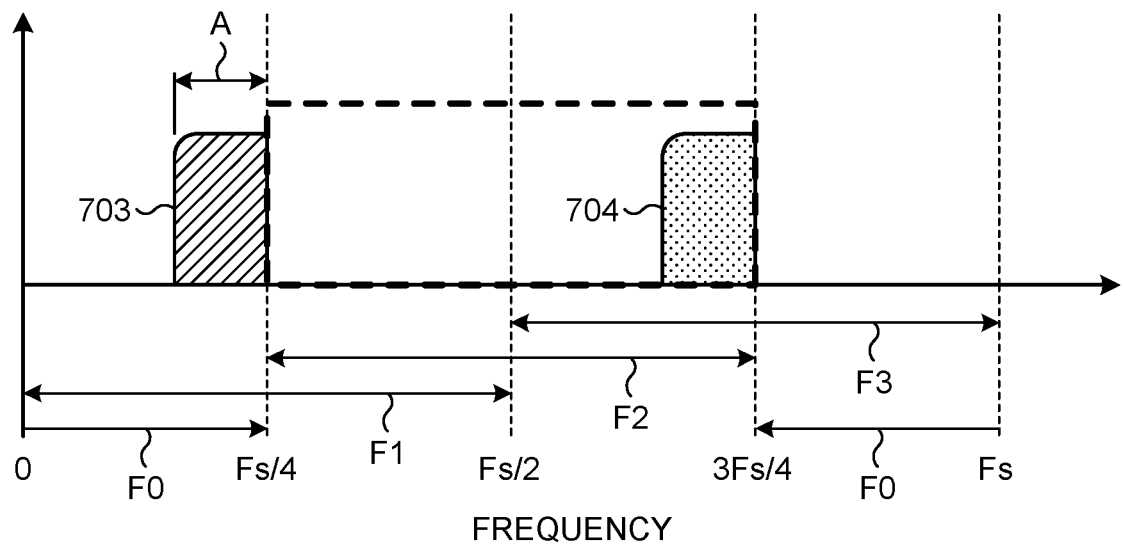
FIG. 11 is a diagram illustrating an example of spectrum resulting from interference cancellation performed on the interference illustrated in FIG. 9 by band limitation to passband F2, in the interference cancellation device according to the first embodiment.

Similarly, in the case of performing interference cancellation on the interference illustrated in FIG. 9 using the interference replica generated as a result of the limitation of the band to passband F2 that is the upper portion of the sub-band, the spectrum resulting from the interference cancellation appears as illustrated in FIG. 11. FIG. 11 is a diagram illustrating an example of spectrum resulting from interference cancellation performed on the interference illustrated in FIG. 9 by band limitation to passband F2, in the interference cancellation device 1 according to the first embodiment. As illustrated in FIG. 11, two elements, i.e., a residual interference 703 and a residual interference 704 remain as residual interference. The residual interference 703 is a portion protruding out from passband F2. The residual interference 704 is a falsely replicated image. In this case, the residual interference-noise power value is proportional to the frequency width of the portion protruding out from passband F2. When interference cancellation is performed using passband F2 illustrated in FIG. 11, residual interference-noise power $P_L$ is expressed by Equation (5). Note that, in Equation (5), A represents the bandwidth of the residual interference.

[Formula 5]

$$P_L = \frac{2A}{W}I + 2N \tag{5}$$

Figure 12:
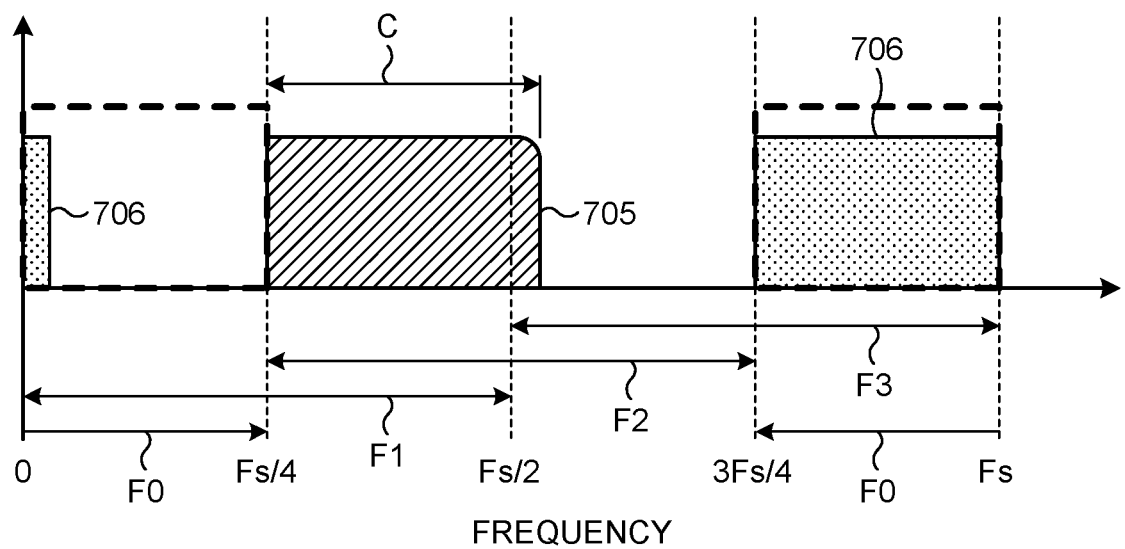
FIG. 12 is a diagram illustrating an example of spectrum resulting from interference cancellation performed on the interference illustrated in FIG. 9 by band limitation to passband F0, in the interference cancellation device according to the first embodiment.

In addition, in the case of performing interference cancellation on the interference illustrated in FIG. 9 using the interference replica generated as a result of the limitation of the band to passband F0 that is the lower portion of the sub-band, the spectrum resulting from the interference cancellation appears as illustrated in FIG. 12. FIG. 12 is a diagram illustrating an example of spectrum resulting from interference cancellation performed on the interference illustrated in FIG. 9 by band limitation to passband F0, in the interference cancellation device 1 according to the first embodiment. As illustrated in FIG. 12, two elements, i.e., a residual interference 705 and a residual interference 706 remain as residual interference. The residual interference 705 is a portion protruding out from passband F0. The residual interference 706 is a falsely replicated image. In this case, the residual interference-noise power value is proportional to the frequency width of the portion protruding out from passband F0. When interference cancellation is performed using passband F0 illustrated in FIG. 12, residual interference-noise power $P_H$ is expressed by Equation (6). Note that, in Equation (6), C represents the bandwidth of the residual interference.

[Formula 6]

$$P_H = \frac{2C}{W}I + 2N \tag{6}$$

Figure 13:
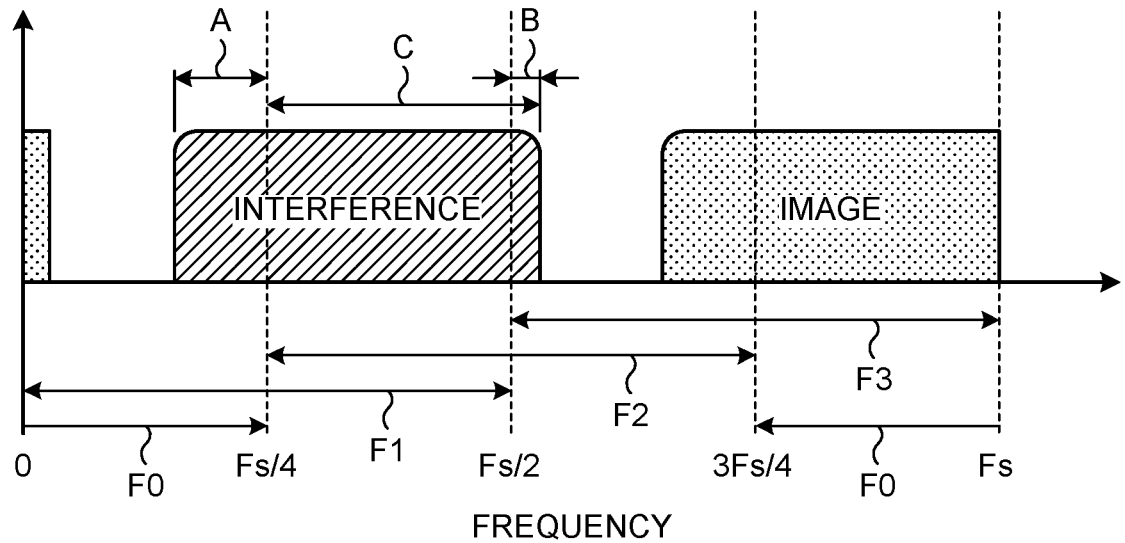
FIG. 13 is a diagram illustrating relationships among bandwidths of individual residual interferences in a case in which interference cancellation is performed on the interference illustrated in FIG. 9 by band limitation to each of passbands F0, F1, and F2, in the interference cancellation device according to the first embodiment.

FIG. 13 is a diagram illustrating relationships among the bandwidths of the individual residual interferences in the cases in which interference cancellation is performed on the interference illustrated in FIG. 9 by band limitation to each of passbands F0, F1, and F2, in the interference cancellation device 1 according to the first embodiment. As illustrated in FIG. 13, the bandwidths A, B, and C, the interference bandwidth W, and the system bandwidth Fs have relationships of Equations (7) and (8).

$$W = A + C \tag{7}$$

$$C = B + Fs/4 \tag{8}$$

According to the foregoing relationships, the second interference center frequency estimated-value candidate 504 is expressed as Equation (9). Note that, in Equation (9), $f_0$ represents the lower frequency end of passband F2 that is the upper portion of the sub-band.

[Formula 7]

$$f_c = f_0 + \frac{\frac{F_S}{4}\left(1 - \frac{P_L - P_M}{P_H - P_M}\right)}{2} \tag{9}$$

Figure 14:
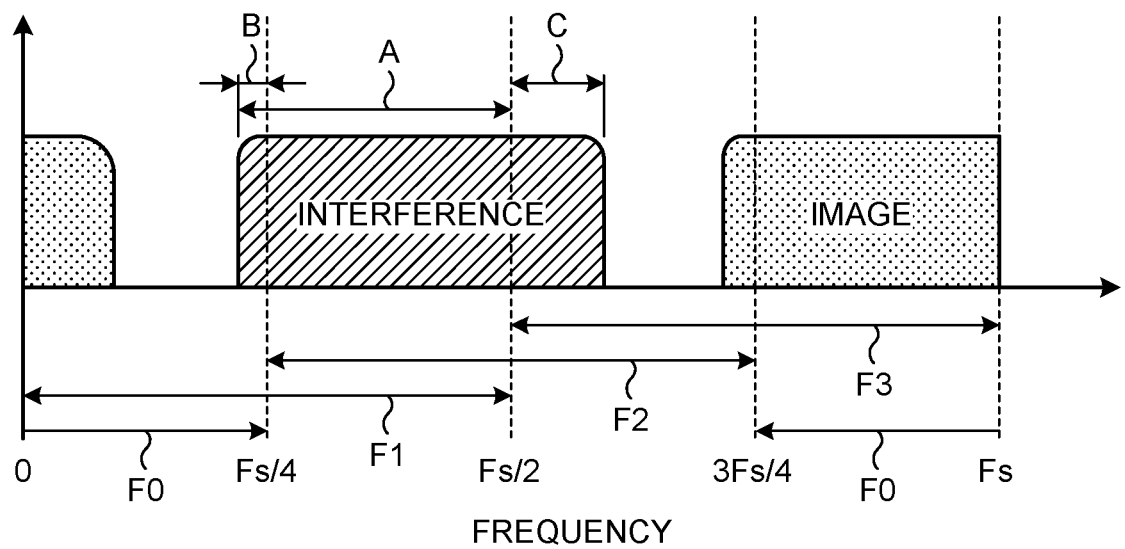
FIG. 14 is a diagram illustrating relationships among bandwidths of individual residual interferences in a case in which interference cancellation is performed by band limitation to each of passbands F1, F2, and F3 when a majority portion of interference exists in a lower part of a main band, in the interference cancellation device according to the first embodiment.

The examples of FIGS. 9 to 13 illustrate a case in which a majority portion of interference exists in an upper part of the main band. In contrast, a case in which a majority portion of interference exists in a lower part of the main band is illustrated as FIG. 14. FIG. 14 is a diagram illustrating relationships among the bandwidths of the individual residual interferences in a case in which interference cancellation is performed by band limitation to each of passbands F1, F2, and F3 when a majority portion of interference exists in the lower part of the main band, in the interference cancellation device 1 according to the first embodiment. As illustrated in FIG. 14, the bandwidths A, B, and C, the interference bandwidth W, and the system bandwidth Fs have relationships of Equations (10) and (11).

$$W = A + C \tag{10}$$

$$A = B + Fs/4 \tag{11}$$

According to the foregoing relationships, the second interference center frequency estimated-value candidate 504 is expressed as Equation (12). Note that, in Equation (12), $f_1$ represents the lower frequency end of passband F3 that is the upper portion of the sub-band.

[Formula 8]

$$f_c = f_1 + \frac{\frac{F_S}{4}\left(1 - \frac{P_L - P_M}{P_H - P_M}\right)}{2\frac{P_L - P_M}{P_H - P_M}} \tag{12}$$

The interference center frequency calculation unit 54 determines whether the majority portion of interference exists in the upper part or in the lower part by, for example, comparing the interference sub-band lower-portion residual interference-noise power 501c and the interference sub-band upper-portion residual interference-noise power 501d.

As described above, the interference center frequency calculation unit 54 calculates the second interference center frequency estimated-value candidate 504 based on the residual interference-noise power values 207a to 207d after interference cancellation by the multiple band-limiting filters 21a to 21d having passbands defined relative to the system bandwidth Fs that is the frequency band over which the received signal 100 is transmitted, the passbands of the band-limiting filters 21a to 21d having lower frequency ends being offset relative to each other by a predetermined frequency. Specifically, when a null symbols are inserted into data symbols at a ratio of 1:1 in the received signal 100, the interference center frequency calculation unit 54 calculates the second interference center frequency estimated-value candidate 504, using the residual interference-noise power values 207a to 207d after interference cancellation, the post-interference-cancellation residual interference-noise power values 207a to 207d being obtained using the band-limiting filters 21a to 21d having passbands each being half the system bandwidth Fs, the passbands of the band-limiting filters 21a to 21d having lower frequency ends being offset relative to each other by one quarter (¼) of the system bandwidth Fs.

The selection unit 55 selects, on the basis of the interference bandwidth 205, which one of the first interference center frequency estimated-value candidate 503 estimated by the interference center frequency calculation unit 53 through method 1 and the second interference center frequency estimated-value candidate 504 estimated by the interference center frequency calculation unit 54 through method 2 is to be used (step S35). The selection unit 55 outputs the interference center frequency estimated value 106 that is the selected one of the first interference center frequency estimated-value candidate 503 and the second interference center frequency estimated-value candidate 504 (step S36). For example, the selection unit 55 selects the first interference center frequency estimated-value candidate 503 provided through method 1 when the interference bandwidth 205 is greater than or equal to ¼ of the system bandwidth Fs, and otherwise selects the second interference center frequency estimated-value candidate 504 provided through method 2. That is, the selection unit 55 determines, on the basis of the interference bandwidth 205, which one of the first interference center frequency estimated-value candidate 503 and the second interference center frequency estimated-value candidate 504 to output as the interference center frequency estimated value 106.

A hardware configuration of the interference cancellation device 1 will next be described. In the interference cancellation device 1, the data symbol extraction unit 11, the null symbol extraction unit 12, the data symbol power calculation unit 13, the null symbol power calculation unit 14, the null symbol spectrum calculation unit 15, the interference center frequency estimation unit 16, and the interference cancellation unit 17 are implemented in processing circuitry. The processing circuitry may be a set of a processor that executes a program stored in a memory and the memory, or a dedicated hardware element. The processing circuitry is also called a control circuit.

Figure 15:
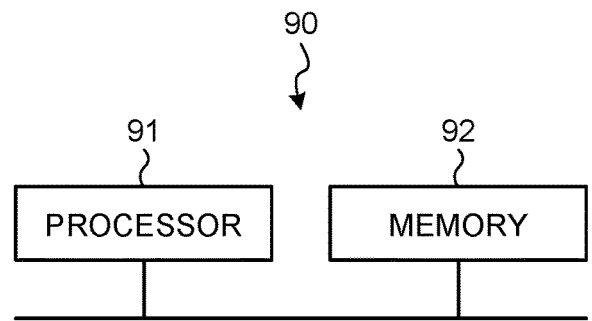
FIG. 15 is a diagram illustrating an example configuration of a processing circuitry included in the interference cancellation device according to the first embodiment in a case in which the processing circuitry is implemented by a processor and a memory.

FIG. 15 is a diagram illustrating an example configuration of a processing circuitry 90 included in the interference cancellation device 1 according to the first embodiment in a case in which the processing circuitry is implemented by a processor and a memory. The processing circuitry 90 illustrated in FIG. 15 is a control circuit, and includes a processor 91 and a memory 92. In a case in which the processing circuitry 90 includes the processor 91 and the memory 92, each functionality of the processing circuitry 90 is implemented in software, firmware, or a combination of software and firmware. The software or firmware is described as a program, and stored in the memory 92. In the processing circuitry 90, the processor 91 reads and executes a program stored in the memory 92 to implement each functionality. That is, the processing circuitry 90 includes the memory 92 for storing a program that causes a process of the interference cancellation device 1 to be performed. It can also be said that this program is a program for causing the interference cancellation device 1 to perform each functionality implemented by the processing circuitry 90. This program may be provided via a storage medium that stores the program or via another means such as a communication medium.

It is said that the foregoing program causes the interference cancellation device 1 to perform: a first step in which the data symbol extraction unit 11 extracts a data symbol portion from a received signal 100 having null symbols inserted into data symbols, and outputs a data symbol signal 101; a second step in which the null symbol extraction unit 12 extracts a null symbol portion from the received signal 100, and outputs a null symbol signal 102; a third step in which the data symbol power calculation unit 13 calculates a data symbol power estimated value 103 that represents the electric power of the data symbol signal 101; a fourth step in which the null symbol power calculation unit 14 calculates a null symbol power estimated value 104 that represents the electric power of the null symbol signal 102; a fifth step in which the null symbol spectrum calculation unit 15 calculates a null symbol spectrum 105 from the null symbol signal 102; and a sixth step in which the interference center frequency estimation unit 16 calculates an interference center frequency estimated value 106 of an interference 401 included in the received signal 100, using the data symbol signal 101, the data symbol power estimated value 103, the null symbol power estimated value 104, and the null symbol spectrum 105, wherein in calculating the interference center frequency estimated value 106, the interference center frequency estimation unit 16 compares the null symbol spectrum 105 with a predefined threshold 404, and determines that a half of total bandwidth of the frequency bands each having electric power in excess of the threshold 404 is the interference bandwidth of the interference 401, and, in calculation of the interference bandwidth, the interference center frequency estimation unit 16 eliminates the effect of the image 402 for the interference 401.

In this example, the processor 91 is, for example, a central processing unit (CPU), a processing unit, a computing unit, a microprocessor, a microcomputer, a digital signal processor (DSP), or the like. In addition, the memory 92 is, for example, a non-volatile or volatile semiconductor memory such as a random access memory (RAM), a read-only memory (ROM), a flash memory, an erasable programmable ROM (EPROM), or an electrically erasable programmable ROM (EEPROM) (registered trademark); a magnetic disk, a flexible disk, an optical disk, a compact disc, a MiniDisc, a digital versatile disc (DVD), or the like.

Figure 16:
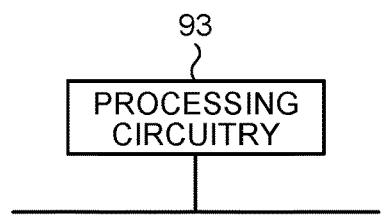
FIG. 16 is a diagram illustrating an example of a processing circuitry included in the interference cancellation device according to the first embodiment in a case in which the processing circuitry is formed of a dedicated hardware element.

FIG. 16 is a diagram illustrating an example of a processing circuitry 93 included in the interference cancellation device 1 according to the first embodiment in a case in which the processing circuitry includes a dedicated hardware element. The processing circuitry 93 illustrated in FIG. 16 is, for example, a single circuit, a set of multiple circuits, a programmed processor, a parallel programmed processor, an application specific integrated circuit (ASIC), a field programmable gate array (FPGA), or a combination thereof. The processing circuitry may be implemented partially in a dedicated hardware element, and partially in software or firmware. Thus, the processing circuitry is capable of implementing each functionality described above using a dedicated hardware element, software, firmware, or a combination thereof.

As described above, and according to the present embodiment, in estimating the interference center frequency from the spectrum of the interference component superimposed on a null symbol portion included in the received signal 100, the interference cancellation device 1 identifies an actual interference and an image, eliminates the effect of this image, and then estimates the interference center frequency. This enables the interference cancellation device 1 to improve accuracy of estimation of the interference center frequency of the interference band included in the received signal 100.

Second Embodiment

Figure 17:
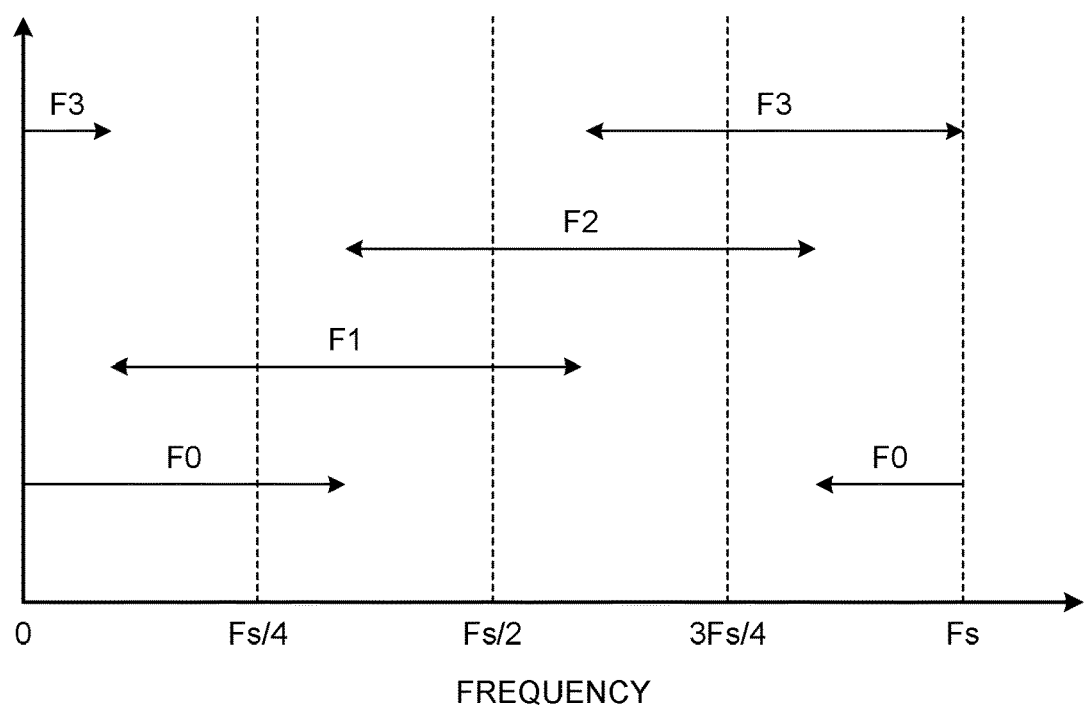
FIG. 17 is a diagram illustrating relationships among the passbands of individual band-limiting filters and the system bandwidth according to a second embodiment.

In the interference cancellation device 1 of the first embodiment, the band-limiting filters 21a to 21d of the interference center frequency estimation unit 16 have passbands set as illustrated in FIG. 5, but the passbands are not limited thereto. The interference cancellation device 1 may have passbands set, for example, as illustrated in FIG. 17. FIG. 17 is a diagram illustrating relationships among the passbands of the individual band-limiting filters 21a to 21d and the system bandwidth Fs according to a second embodiment. Where the passbands each have a bandwidth of half of the system bandwidth Fs, and the lower frequency ends of the individual passbands are offset relative to each other by one quarter (¼) of the system bandwidth Fs, the interference cancellation device 1 can calculate a center frequency estimated value through a method similar to the method of the first embodiment.

Third Embodiment

The assumption in the first embodiment is that the transmission device that transmits a signal to the reception device including the interference cancellation device 1 inserts null symbols into data symbols at a ratio of 1:1, but the ratio is not limited thereto. The interference cancellation device 1 is also applicable in the case where a ratio of the null symbol to the data symbol is 1:N, and N is a natural number greater than or equal to 2. In the case where the ratio of the null symbol to the data symbol is 1:N, the interference cancellation device 1 includes band-limiting filters whose number is 4N, in place of the band-limiting filters 21*a* to 21*d* illustrated in FIG. 3, and the bandwidths of the passbands of the 4N band-limiting filters are each a ½N of the system bandwidth Fs, the passbands having lower frequency ends being offset relative to each other by ¼N of the system bandwidth Fs. In this case, the interference cancellation device 1 can calculate a center frequency estimated value through a method similar to the method of the first embodiment.

Specifically, when null symbols are inserted into data symbols at a ratio of 1:N in the received signal 100, the interference center frequency calculation unit 54 calculates the second interference center frequency estimated-value candidate 504, using the residual interference-noise power values 207*a* to 207*d* after interference cancellation, the post-interference-cancellation residual interference-noise power values 207*a* to 207*d* being obtained using the band-limiting filters 21*a* to 21*d* having passbands each being ½N of the system bandwidth Fs, the passbands of the band-limiting filters 21*a* to 21*d* having lower frequency ends being offset relative to each other by ¼N of the system bandwidth Fs.

Fourth Embodiment

In the interference cancellation device 1 of the first embodiment, the selection unit 55 determines, on the basis of the interference bandwidth 205, which one of the first interference center frequency estimated-value candidate 503 provided through method 1 and the second interference center frequency estimated-value candidate 504 provided through method 2 to output as the interference center frequency estimated value 106. Note that the selection unit 55 may use another method as long as it can be determined that an interference is present within the interference main band 501*a*.

For example, when an interference is present within the interference main band 501*a*, the interference main band residual interference-noise power 501*b* of the interference main band is significantly lower than the post-interference-cancellation interference sub-band lower-portion residual interference-noise power 501*c* and the post-interference-cancellation interference sub-band upper-portion residual interference-noise power 501*d*, of the interference sub-band. Using these relationships, the selection unit 55 compares differences between the interference main band residual interference-noise power 501*b*, and the post-interference-cancellation interference sub-band lower-portion residual interference-noise power 501*c* and the post-interference-cancellation interference sub-band upper-portion residual interference-noise power 501*d*, of the interference sub-band. The selection unit 55 selects the first interference center frequency estimated-value candidate 503 provided through method 1 when the differences are greater than a predefined threshold, and selects the second interference center frequency estimated-value candidate 504 provided through method 2 when the differences are not greater than the threshold. That is, the selection unit 55 determines, on the basis of these residual interference-noise power values, which one of the first interference center frequency estimated-value candidate 503 and the second interference center frequency estimated-value candidate 504 to output as the interference center frequency estimated value 106.

An interference cancellation device according to the present disclosure provides an advantage of improving the accuracy of estimation of the interference center frequency of the interference band included in the received signal.

The configurations described in the foregoing embodiments are merely examples. These configurations may be combined with a known other technology, and configurations of different embodiments may be combined together. Moreover, a part of the configurations may be omitted and/or modified without departing from the spirit thereof.

What is claimed is:

1. An interference cancellation device comprising:
data symbol extraction circuitry to extract a data symbol portion from a received signal having null symbols inserted into data symbols, and output a data symbol signal;
null symbol extraction circuitry to extract a null symbol portion from the received signal, and output a null symbol signal;
data symbol power calculation circuitry to calculate a data symbol power estimated value representing electric power of the data symbol signal;
null symbol power calculation circuitry to calculate a null symbol power estimated value representing electric power of the null symbol signal;
null symbol spectrum calculation circuitry to calculate a null symbol spectrum from the null symbol signal; and
interference center frequency estimation circuitry to calculate an interference center frequency estimated value of an interference included in the received signal, using the data symbol signal, the data symbol power estimated value, the null symbol power estimated value, and the null symbol spectrum, wherein, in calculating the interference center frequency estimated value, the interference center frequency estimation circuitry compares the null symbol spectrum with a predefined threshold, and determines that a half of total bandwidth of frequency bands each having electric power in excess of the threshold is an interference bandwidth of the interference, and, in calculation of the interference bandwidth, the interference center frequency estimation circuitry eliminates an effect of an image for the interference.

2. The interference cancellation device according to claim 1, wherein
the interference center frequency estimation circuitry calculates, using the null symbol spectrum, a first interference center frequency estimated-value candidate based on a weighted average of an interference spectrum, calculates a second interference center frequency estimated-value candidate based on residual interference-noise power values after interference cancellation by a plurality of band-limiting filters, and outputs either the first interference center frequency estimated-value candidate or the second interference center frequency estimated-value candidate as the interference center frequency estimated value, the plurality of band-limiting filters having passbands defined relative to a system bandwidth, the passbands having lower frequency ends being offset relative to each other by a predefined frequency, the system bandwidth being a frequency band over which the received signal is transmitted.

3. The interference cancellation device according to claim 2, wherein
when the null symbols are inserted into the data symbols at a ratio of 1:1 in the received signal,
the interference center frequency estimation circuitry calculates the second interference center frequency estimated-value candidate, using the residual interference-noise power values after interference cancellation, the residual interference-noise power values after interference cancellation being obtained using the band-limiting filters having passbands each being half the system bandwidth, the passbands having lower frequency ends being offset relative to each other by one quarter of the system bandwidth.

4. The interference cancellation device according to claim 2, wherein
when the null symbols are inserted into the data symbols at a ratio of 1:N in the received signal, N being a natural number greater than or equal to 2,
the interference center frequency estimation circuitry calculates the second interference center frequency estimated-value candidate, using the residual interference-noise power values after interference cancellation, the residual interference-noise power values after interference cancellation being obtained using the band-limiting filters having passbands each being ½N of the system bandwidth, the passband having lower frequency ends being offset relative to each other by ¼N of the system bandwidth.

5. The interference cancellation device according to claim 2, wherein
the interference center frequency estimation circuitry determines, on the basis of the residual interference-noise power values, which one of the first interference center frequency estimated-value candidate and the second interference center frequency estimated-value candidate to output as the interference center frequency estimated value.

6. The interference cancellation device according to claim 2, wherein
the interference center frequency estimation circuitry determines, on the basis of the interference bandwidth, which one of the first interference center frequency estimated-value candidate and the second interference center frequency estimated-value candidate to output as the interference center frequency estimated value.

7. The interference cancellation device according to claim 1, comprising:
interference cancellation circuitry to perform interference cancellation on the data symbol signal, using an interference replica signal generated on the basis of the interference center frequency estimated value and the null symbol spectrum.

8. A control circuit to control an interference cancellation device, the control circuit causing the interference cancellation device to:

extract a data symbol portion from a received signal having null symbols inserted into data symbols, and output a data symbol signal;
extract a null symbol portion from the received signal, and output a null symbol signal;
calculate a data symbol power estimated value representing electric power of the data symbol signal;
calculate a null symbol power estimated value representing electric power of the null symbol signal;
calculate a null symbol spectrum from the null symbol signal;
calculate an interference center frequency estimated value of an interference included in the received signal, using the data symbol signal, the data symbol power estimated value, the null symbol power estimated value, and the null symbol spectrum, wherein the control circuit causes the interference cancellation device to, in calculating the interference center frequency estimated value, compare the null symbol spectrum with a predefined threshold, and determine that a half of total bandwidth of frequency bands each having electric power in excess of the threshold is an interference bandwidth of the interference, and to, in calculation of the interference bandwidth, eliminate an effect of an image for the interference.

9. A non-transitory storage medium storing a program to control an interference cancellation device,
the program causing the interference cancellation device to:
extract a data symbol portion from a received signal including a null symbol inserted into data symbols, and output a data symbol signal;
extract a null symbol portion from the received signal, and output a null symbol signal;
calculate a data symbol power estimated value representing electric power of the data symbol signal;
calculate a null symbol power estimated value representing electric power of the null symbol signal;
calculate a null symbol spectrum from the null symbol signal;
calculate an interference center frequency estimated value of an interference included in the received signal, using the data symbol signal, the data symbol power estimated value, the null symbol power estimated value, and the null symbol spectrum, wherein the program causes the interference cancellation device to, in calculating the interference center frequency estimated value, compare the null symbol spectrum with a predefined threshold, and determine that a half of total bandwidth of frequency bands each having electric power in excess of the threshold is an interference bandwidth of the interference, and to, in calculation of the interference bandwidth, eliminate an effect of an image for the interference.

10. An interference center frequency estimation method comprising:
extracting a data symbol portion from a received signal having null symbols inserted into data symbols, and outputting a data symbol signal;
extracting a null symbol portion from the received signal, and outputting a null symbol signal;
calculating a data symbol power estimated value representing electric power of the data symbol signal;
calculating a null symbol power estimated value representing electric power of the null symbol signal;

a fifth step in which a null symbol spectrum calculation unit calculates calculating a null symbol spectrum from the null symbol signal;

calculating an interference center frequency estimated value of an interference included in the received signal, using the data symbol signal, the data symbol power estimated value, the null symbol power estimated value, and the null symbol spectrum, wherein, when the interference center frequency estimated value is calculated, the null symbol spectrum is compared with a predefined threshold, and a half of total bandwidth of frequency bands each having electric power in excess of the threshold is determined to be an interference bandwidth of the interference, and, in calculation of the interference bandwidth, an effect of an image for the interference is eliminated.

11. The interference cancellation device according to claim 3, wherein
the interference center frequency estimation circuitry determines, on the basis of the residual interference-noise power values, which one of the first interference center frequency estimated-value candidate and the second interference center frequency estimated-value candidate to output as the interference center frequency estimated value.

12. The interference cancellation device according to claim 4, wherein
the interference center frequency estimation circuitry determines, on the basis of the residual interference-noise power values, which one of the first interference center frequency estimated-value candidate and the second interference center frequency estimated-value candidate to output as the interference center frequency estimated value.

13. The interference cancellation device according to claim 3, wherein
the interference center frequency estimation circuitry determines, on the basis of the interference bandwidth, which one of the first interference center frequency estimated-value candidate and the second interference center frequency estimated-value candidate to output as the interference center frequency estimated value.

14. The interference cancellation device according to claim 4, wherein
the interference center frequency estimation circuitry determines, on the basis of the interference bandwidth, which one of the first interference center frequency estimated-value candidate and the second interference center frequency estimated-value candidate to output as the interference center frequency estimated value.

15. The interference cancellation device according to claim 2, comprising:
interference cancellation circuitry to perform interference cancellation on the data symbol signal, using an interference replica signal generated on the basis of the interference center frequency estimated value and the null symbol spectrum.

16. The interference cancellation device according to claim 3, comprising:
interference cancellation circuitry to perform interference cancellation on the data symbol signal, using an interference replica signal generated on the basis of the interference center frequency estimated value and the null symbol spectrum.

17. The interference cancellation device according to claim 4, comprising:
interference cancellation circuitry to perform interference cancellation on the data symbol signal, using an interference replica signal generated on the basis of the interference center frequency estimated value and the null symbol spectrum.

18. The interference cancellation device according to claim 5, comprising:
interference cancellation circuitry to perform interference cancellation on the data symbol signal, using an interference replica signal generated on the basis of the interference center frequency estimated value and the null symbol spectrum.

19. The interference cancellation device according to claim 6, comprising:
interference cancellation circuitry to perform interference cancellation on the data symbol signal, using an interference replica signal generated on the basis of the interference center frequency estimated value and the null symbol spectrum.

* * * * *